United States Patent
Han

(10) Patent No.: US 6,863,752 B1
(45) Date of Patent: Mar. 8, 2005

(54) METHOD OF PRODUCING A SUPERCONDUCTING TAPE

(75) Inventor: Zhenghe Han, Herlev (DK)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/856,147

(22) PCT Filed: Nov. 29, 1999

(86) PCT No.: PCT/DK99/00655
§ 371 (c)(1),
(2), (4) Date: Jun. 20, 2001

(87) PCT Pub. No.: WO00/33393
PCT Pub. Date: Jun. 8, 2000

(30) Foreign Application Priority Data

Nov. 30, 1998 (DK) .......................... 1998 01577

(51) Int. Cl.$^7$ ............................ H01B 12/10; H01L 39/24
(52) U.S. Cl. ................... 156/52; 505/230; 505/433; 505/434; 174/125.1; 427/62; 29/599
(58) Field of Search ................... 156/51, 52; 505/230, 505/430, 433, 434, 470; 174/125.1; 427/62; 29/599

(56) References Cited

U.S. PATENT DOCUMENTS

| | | |
|---|---|---|
| 3,733,692 A | 5/1973 | Fietz et al. |
| 4,407,062 A | 10/1983 | Sutcliffe et al. |
| 5,122,507 A | 6/1992 | Yamamoto et al. |
| 5,296,456 A | 3/1994 | Shiga et al. |
| 5,360,784 A | 11/1994 | Kimura et al. |
| 5,999,383 A * | 12/1999 | Hall et al. ............... 361/19 |
| 6,021,338 A * | 2/2000 | Zahora et al. ........... 505/230 |
| 6,205,345 B1 * | 3/2001 | Sato et al. ............... 505/231 |

FOREIGN PATENT DOCUMENTS

| | | |
|---|---|---|
| EP | 0 044 144 | 1/1982 |
| EP | 0 449 316 | 10/1991 |

OTHER PUBLICATIONS

Patent Abstract of Japan, JP 9–082147, Mar. 28, 1997.

* cited by examiner

*Primary Examiner*—Jeff H. Aftergut
*Assistant Examiner*—John T. Haran
(74) *Attorney, Agent, or Firm*—Oblon, Spivak, McCelland, Maier & Neustadt, P.C.

(57) ABSTRACT

A method and article for producing a high transition temperature superconducting tape or wire with a normal metal sheath and at least two surface layers, an inner electrically insulating layer and an outer low friction layer. The method includes mechanical deformation and a plurality of annealing steps, and the application of at least one surface layer after the final annealing step. The coating materials are selected based on their electrical insulation and friction, as well as their compatibility with cryogenic conditions and coating methods.

18 Claims, 2 Drawing Sheets

METHOD OF PRODUCING A SUPERCONDUCTING TAPE

TECHNICAL FIELD

This invention relates to a method of producing a High Tc superconducting tape or a High Tc superconducting wire in a metallic sheath.

BACKGROUND ART

A high Tc superconducting wire/tape is usually a composite consisting of a superconducting core and a metallic sheath. Many properties of the wire/tape depend on the metallic sheath materials. Additional layers over the metallic sheath can, however, modify the properties of the wire/tape, as described below in several examples.

(1) A superconducting device such as a motor, a transformer cable or a magnet requires additional insulating materials between the wires or between the adjacent turns of the winding in order to prevent short circuiting. According to EP 0 786 783 insulating layers have been applied between the superconducting layers formed by bare Bi-2223 tapes. High Tc wires having insulating surface layers could simplify the process of making superconducting devices and the volume of the devices could be reduced.

(2) The mechanical strength of a high Tc superconducting wire/tape depends on the sheath material. An Ag alloy sheathed tape is for instance much stronger than a tape sheathed with pure Ag. However, it is difficult to distinguish the Ag alloy from the pure Ag just by looking. The additional surface layer can be coloured or marked which enable to distinguish between different kinds of wire/tapes. It is common that a tape is annealed in a pan-cake or solenoid form. Asymmetry pre-stress could be built up during the annealing and therefore two sides of a high Tc tape could have different mechanical properties. It is therefore very important to be able to distinguish between the two different sides during a winding process, for instance by using different colours to distinguish between the two sides of the tape, one colour for the tensile stressed side and another colour for the compressed stressed side. As a result a degrading of the wire/tape could be omitted.

(3) The Ag or Ag alloy sheath is not completely gas tight or liquid tight. Long time exposure in air or long time in contact with liquid nitrogen could cause a degrading of the high Tc wire/tape. An additional layer could protect the tape from moisture, water, liquid nitrogen or other chemicals which could degrade the superconducting tape.

(4) The additional layer could change the surface friction of the wire/tape. A low friction is for instance needed for winding a superconducting cable.

Such additional layers could be applied by known techniques.

According to U.S. Pat. No. 4,927,985 an insulating layer is applied inside a conductor and the surface of the conductor is metallic. By this construction the insulating layer should be put in the conductor before the mechanical deformation and heat treatment. The materials suitable for the insulating layer are therefore restricted and organic materials cannot be used.

EP0044144 (U.S. Pat. No. 4,407,062) concerns a low Tc superconductor. Low Tc superconductors are totally different from high Tc superconducting materials. The low Tc materials mentioned in EP 0044144 is intermetallic. High Tc superconductors are ceramic. The method for producing the low Tc superconductor is therefore different from the method for producing high Tc superconductors.

Moreover the coating according to EP0044144 is applied before the final heat treatment The coating materials are therefore for high temperature use and could for instance be composite of silicate, chalk and China clay.

Without elevated temperature heat treatment the coating is not stable. It can be simply removed by dipping in hot water and wiping (see EP0044144, page 10, lines 7–10).

From EP 04449316 A1 it is known to cover a superconducting wire with an organic coat so as to stabilize the superconducting wire against bending.

BRIEF DESCRIPTION OF THE INVENTION

The object of the invention is to illustrate how the restriction as to the materials could be omitted and according to the invention the additional layer/layers is/are applied after the final annealing. As a result the above-mentioned problems have been solved.

According to the invention the coating is performed after the final heat treatment and the coating materials are typically polymers and may be selected from a group consisting of polyurethane, polyesterimide, epoxy, polytetrafluoroethylene or Teflon®, or another insulating material. In addition, the surface layers may contain any of a group consisting of ceramic powder, graphite, carbon fiber, or metallic polymeric or elastomeric particles or fibers.

By using a coloured or a marked surface layer one will be able to distinguish between the different wires or different portions of the same wire, for instance to mark one of the sides of the wire/tape.

According to the invention the surface layer could have a low friction and for instance being composed of teflon. Low friction is for instance-needed for winding of a superconducting cable.

BRIEF DESCRIPTION OF THE DRAWINGS

In the following the invention will be disclosed in closer detail with reference to the attached figures.

BEST MODE FOR CARRYING OUT THE INVENTION

EXAMPLE 1

Figure 1:
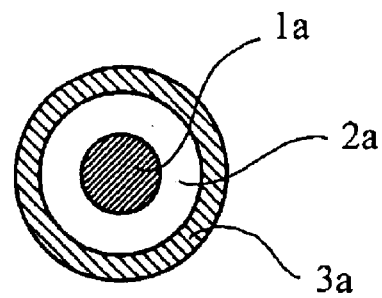
FIG. 1 is a sectional view of a high Tc superconducting wire.

In FIG. 1, an insulating layer (3a) of a thickness of 0.015 mm is applied to a high Tc Bi-2212 wire having a ceramic Bi-2212 core (1a) and a metallic sheath (2a). The material of the insulating surface layer is PVB and is applied to the wire by a standard dip-coating method at a speed of 5 meters/min using alcohol as a solvent for PVB (5 weight % of PVB). Thereafter, the solvent is evaporated and the PVB is cured at a temperature of 250° C. in one minute. The surface layer is electrical insulating and can also protect the wire from water and liquid nitrogen.

EXAMPLE 2

Figure 2:
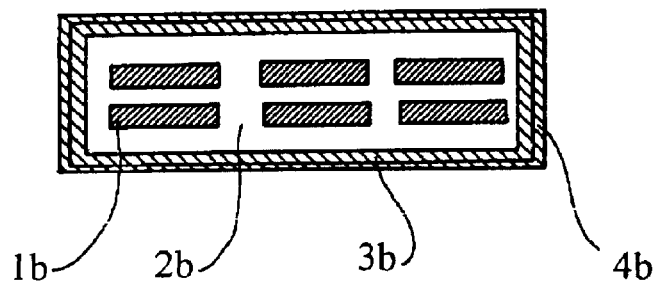
FIG. 2 is a sectional view of a multi-filamentary tape.

In FIG. 2, a surface layer of a multilayer structure is applied to a multifilamentary Bi-2223 tape. This tape contains a number of Bi-2223 filaments (1b) in a metallic matrix (2b). The surface layer contains an insulating layer (3b) and an outer low friction layer (4b). The insulating layer (3b) is applied by using a multifunctional acrylic resin which is cured by means of UV light of 2J/cm2 by using e.g., a standard Nextrom OFC coating line. A suitable material for the low friction is polytetrafluoroethylene or Teflon® which is applied by a standard dry-powder-coating technique using, e.g., a Haugaard powder coating gun. The multilayer surface is insulating and has a low surface friction. A low surface friction can reduce stress in the tape during the winding as well as during the operation of a superconducting apparatus.

EXAMPLE 3

Figure 3:
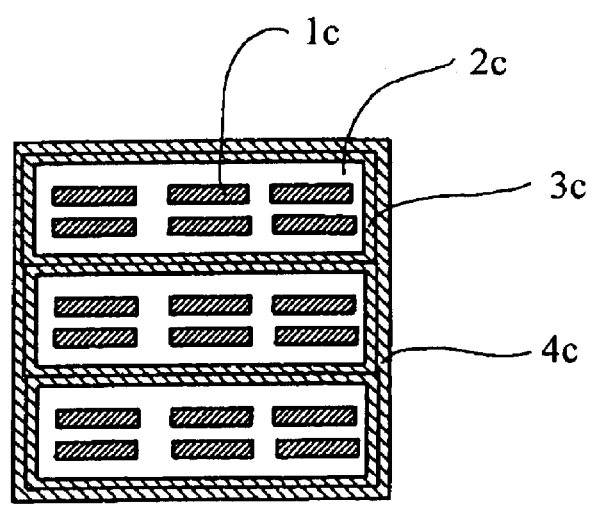
FIG. 3 is a sectional view of a bunch of multi-filamentary tapes.

In FIG. 3, the surface layer is applied to a bunch of multifilamentary Bi-2223 tapes. Each of the Bi-2223 tapes is coated with an insulating layer (3c) using the method according to example 2. The bunch of the tapes is therefore coated with a low friction (4c) layer as described in example 2.

EXAMPLE 4.

Figure 4:
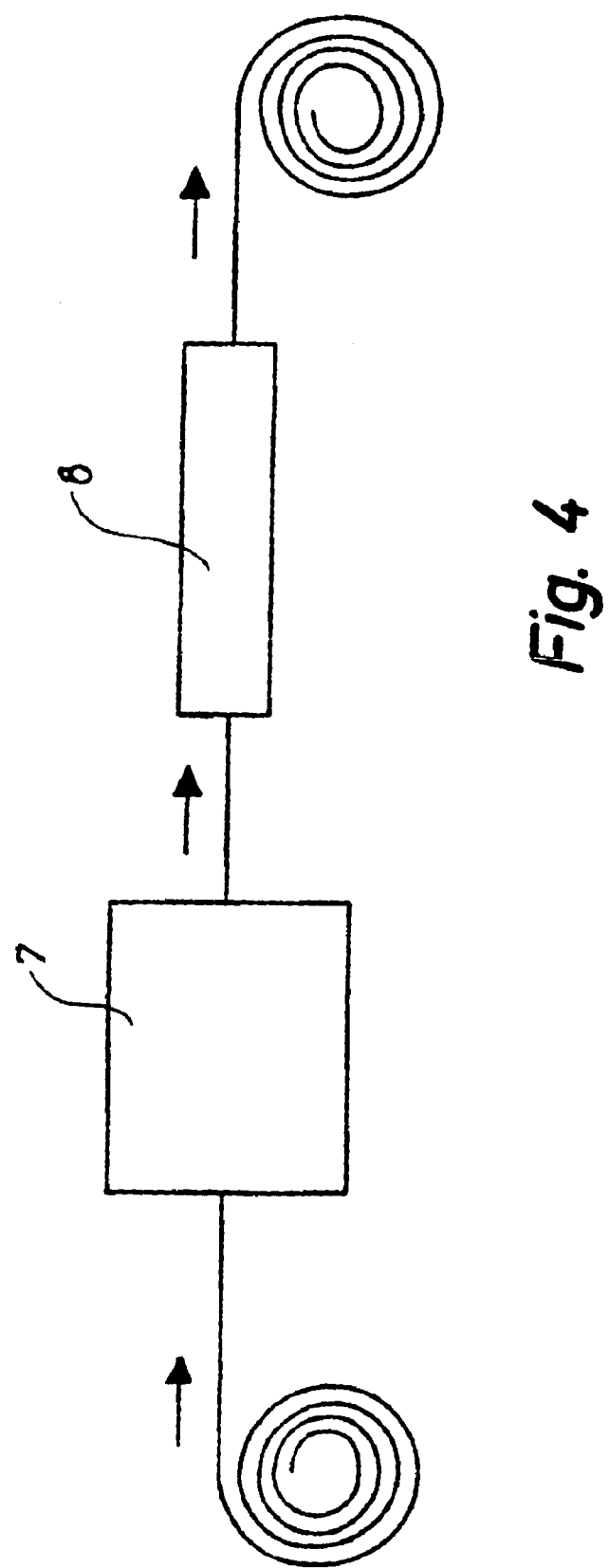
FIG. 4 illustrates a continuous coating line for the surface layer over the high Tc superconducting tape.

FIG. 4 illustrates a continuous coating line for the surface layer over the high Tc superconducting tape. The finally annealed superconducting tape with metallic surface is sent to a coating apparatus 7 where the surface layer is applied over the tape surface. The coating method can be any traditional coating technique, e.g. dip-coating, spraying, extrusion, painting or dry-powder-coating. The tape with the applied layer is thereafter sent to another apparatus for curing 8. The curing method can be heating or UV curing. After the curing step the coated superconducting tape is ready for use. Of course, more steps can be involved when multilayer structure or colouring is needed.

What is claimed is:

1. A method of producing a high Tc superconducting wire, the method comprising the steps of:

providing a superconducting core;

placing a metal sheath around the superconducting core;

performing a plurality of annealing steps; and after a final annealing step, applying a multilayer surface to the wire, the multilayer surface including an electrical insulating layer provided on the metal sheath and a low friction layer provided on the electrical insulating layer.

2. The method according to claim 1, wherein at least one of the electrical insulating layer and the low friction layer is colored or marked so as to be able to distinguish between different wires, different portions of the same wire, or different sides of the same wire.

3. The method according to claim 1, wherein the low friction layer is composed of polytetrafluoroethylene.

4. The method according to claim 1, wherein at least one of the electrical insulating layer and the low friction layer is made of polymeric coating materials which are selected from a group consisting of polyurethane, polyesterimide, epoxy, and polytetrafluoroethylene.

5. The method according to claim 4, wherein at least one of the electrical insulating layer and the low friction layer contains any one selected from a group consisting of ceramic powder, graphite, carbon fiber, and metallic, polymeric or elastomeric particles or fibers.

6. The method according to claim 1, wherein the electrical insulating layer is applied by any one selected from a group consisting of painting, coating, DIP-coating, spraying, and dry powder coating.

7. The method according to claim 4, wherein the coating material is any one selected from a group consisting of thermal curable, UV curable, and solvent based.

8. The method according to claim 1, wherein the multilayer surface is over either a single wire or a bunch of wires.

9. A high Tc superconducting wire comprising a metal sheath containing a superconducting core and at least two surface layers, wherein said at least two surface layers include an inner layer comprised of an electrically insulating polymer or elastomer, and an outer, low friction layer.

10. A method of producing a high Tc superconducting tape, the method comprising the steps of:

providing a plurality of superconducting filaments;

embedding the superconducting filaments in a metal matrix;

performing a plurality of annealing steps; and after a final annealing step, applying a multilayer surface to the tape, the multilayer surface including an electrical insulating layer provided on the metal matrix and a low friction layer provided on the electrical insulating layer.

11. The method according to claim 10, wherein at least one of the electrical insulating layer and the low friction layer is colored or marked so as to be able to distinguish between different tapes, different portions of the same tape, or different sides of the same tape.

12. The method according to claim 10, wherein the low friction layer is composed of polytetrafluoroethylene.

13. The method according to claim 10, wherein at least one of the electrical insulating layer and the low friction layer is made of polymeric coating materials which are selected from a group consisting of polyurethane, polyesterimide, epoxy, and polytetrafluoroethylene.

14. The method according to claim 13, wherein at least one of the electrical insulating layer and the low friction layer contains any one selected from a group consisting of ceramic powder, graphite, carbon fiber, and metallic, polymeric or elastomeric particles or fibers.

15. The method according to claim 10, wherein the electrical insulating layer is applied by any one selected from a group consisting of painting, coating, DIP-coating, spraying, and dry powder coating.

16. The method according to claim 13, wherein the coating material is any one selected from a group consisting of thermal curable, UV curable, and solvent based.

17. The method according to claim 10, wherein the multilayer surface is over either a single tape or a bunch of tapes.

18. A high Tc superconducting tape comprising a metal matrix containing embedded superconducting filaments and at least two surface layers, wherein said at least two surface layers include an inner layer comprised of an electrically insulating polymer or elastomer, and an outer, low friction layer.

* * * * *